(12) United States Patent
Kawada

(10) Patent No.: US 11,424,325 B2
(45) Date of Patent: Aug. 23, 2022

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Yasuyuki Kawada, Tsukuba (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 17/137,568

(22) Filed: Dec. 30, 2020

(65) Prior Publication Data

US 2021/0234005 A1 Jul. 29, 2021

(30) Foreign Application Priority Data

Jan. 29, 2020 (JP) .............................. JP2020-013032

(51) Int. Cl.
*H01L 29/16* (2006.01)
*H01L 21/3115* (2006.01)
(Continued)

(52) U.S. Cl.
CPC ........ *H01L 29/1608* (2013.01); *H01L 21/045* (2013.01); *H01L 21/2253* (2013.01); *H01L 21/31155* (2013.01); *H01L 21/76237* (2013.01); *H01L 29/4236* (2013.01); *H01L 29/66734* (2013.01); *H01L 29/7813* (2013.01)

(58) Field of Classification Search
CPC ............. H01L 21/045; H01L 21/76237; H01L 21/2553; H01L 21/31155; H01L 29/66734; H01L 29/4236; H01L 29/1608
See application file for complete search history.

(56) References Cited

U.S. PATENT DOCUMENTS

2016/0087045 A1* 3/2016 Shimizu ............... H01L 21/324
257/77

FOREIGN PATENT DOCUMENTS

| JP | 3893725 B2 | 3/2007 |
| JP | 2014-222735 A | 11/2014 |
| JP | 2016-063111 A | 4/2016 |

OTHER PUBLICATIONS

Office Action of Japanese Patent Application No. 2020-013032 dated Mar. 3, 2020. (Machine translation provided).

* cited by examiner

*Primary Examiner* — Joseph C. Nicely
(74) *Attorney, Agent, or Firm* — Rabin & Berdo, P.C.

(57) ABSTRACT

Before formation of gate insulating films, an oblique ion implantation of oxygen into opposing sidewalls of trenches, from a top of an oxide film mask is performed, forming oxygen ion-implanted layers in surface regions of the sidewalls. A peak position of oxygen concentration distribution of the oxygen ion-implanted layers is inside the oxide film mask. After removal of the oxide film mask, HTO films constituting the gate insulating films are formed. During deposition of the HTO films, excess carbon occurring at the start of the deposition of the HTO films and in the gate insulating films reacts with oxygen in the oxygen ion-implanted layers, thereby becoming an oxocarbon and being desorbed. The oxygen ion-implanted layers have a thickness in a direction orthogonal to the sidewalls at most half of the thickness of the gate insulating films, and an oxygen concentration higher than any other portion of the semiconductor substrate.

12 Claims, 11 Drawing Sheets

(51) Int. Cl.
*H01L 21/225* (2006.01)
*H01L 29/423* (2006.01)
*H01L 21/04* (2006.01)
*H01L 29/78* (2006.01)
*H01L 29/66* (2006.01)
*H01L 21/762* (2006.01)

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2020-013032, filed on Jan. 29, 2020, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Conventionally, in a trench gate type metal oxide semiconductor field effect transistor (MOSFET) containing silicon carbide (SiC) as a semiconductor material and having an insulated gate having a gate-oxide film-semiconductor three-layered structure, silicon oxide ($SiO_2$) films are provided, forming gate insulating films along inner walls of trenches.

When $SiO_2$ films that form gate insulating films are formed by thermal oxidation, silicon (Si) in the SiC oxidizes at surfaces of the inner walls of the trenches, forming $SiO_2$ films having favorable film quality, however, excess carbon (C) occurs at bonding interfaces (hereinafter, $SiC/SiO_2$ interfaces) between the inner walls of the trenches and the gate insulating films due to this oxidation reaction. This excess carbon is known to adversely affect the $SiC/SiO_2$ interface and to cause degradation of element characteristics.

To suppress the occurrence of excess carbon, there is a method of using, as the gate insulating films, $SiO_2$ films deposited on the inner walls of the trenches instead of $SiO_2$ films formed by thermal oxidation. Nonetheless, for example, $SiO_2$ films deposited by plasma-enhanced chemical vapor deposition (plasma CVD) or sputtering are formed by a low temperature (for example, about 300 degrees C.) and therefore, are not preferable for practical use since film density and insulation characteristics are insufficient.

Further, preferably, the thickness of the gate insulating films is uniform at all portions on the inner walls of the trenches. The thickness being uniform means the thickness is substantially the same and in a range that includes allowable error due to process variation. $SiO_2$ films deposited by plasma CVD or sputtering are problematic in that the thickness thereof differs at portions along sidewalls and portions at bottoms of the trenches, and while only at portions along the sidewalls of the trenches, portions thereof at upper parts of the trenches easily increase in thickness.

In a MOSFET containing SiC as a semiconductor material, the film quality of the gate insulating films affects element characteristics and therefore, normally, $SiO_2$ films (hereinafter, HTO films) deposited as a high temperature oxide (HTO) are often used as the gate insulating films. As compared to $SiO_2$ films deposited by plasma CVD or sputtering, HTO films are deposited at a high temperature, have a uniform thickness, and the film quality thereof is also favorable.

As a method of forming gate insulating films, a method has been proposed in which silicon (Si) is ion implanted at a SiC surface, thereby forming an ion implanted layer; SiC bonds are intentionally broken by the ion implantation and interstitial carbon generated in the ion planted layer is oxidized by a low-temperature oxygen plasma treatment and released externally, whereby the ion implanted layer becomes an Si layer having a low carbon content; the Si layer is oxidized to form gate insulating films having a low carbon content (for example, refer to Japanese Patent No. 3893725).

SUMMARY OF THE INVENTION

According to an embodiment of the invention, a silicon carbide semiconductor device including insulated gates each having a three-layered structure including a gate, an oxide film, and a semiconductor, the silicon carbide semiconductor device includes: a semiconductor substrate constituting the semiconductor and containing silicon carbide, the semiconductor substrate having a first main surface and a second main surface opposite each other; a plurality of trenches each having a predetermined depth from the first main surface of the semiconductor substrate in a depth direction orthogonal to the first main surface of the semiconductor substrate, each trench having an inner wall that includes opposing sidewalls parallel to the depth direction; a plurality of gate insulating films constituting the oxide film, each gate insulating film being provided along said inner wall of said each trench, and being deposited oxide film; and a plurality of gate electrodes constituting the gate, each gate electrode being provided on said each gate insulating film in said each trench. The semiconductor substrate includes a plurality of high-oxygen-concentration regions, each disposed in a region that forms a corresponding one of the opposing sidewalls of said each trench, between a first end and a second end apart from the first end in the depth direction, the first end being located at a position apart from the first main surface of the semiconductor substrate in the depth direction, the second end being located at a position closer to the first main surface than is a bottom of said each trench, each high-oxygen-concentration region extending from a surface of a corresponding one of the opposing sidewalls of said each trench toward inside the semiconductor substrate in a thickness direction orthogonal to the depth direction to have a thickness of at most half of a thickness of said each gate insulating film, and said each high-oxygen-concentration region has an oxygen concentration that is greater than an oxygen concentration of any other region in the semiconductor substrate, that is greater than $1\times10^{15}/cm^3$ and that increases in the thickness direction with increasing proximity to the corresponding one of the opposing sidewall surfaces of said each trench.

Objects, features, and advantages of the present invention are specifically set forth in or will become apparent from the following detailed description of the invention when read in conjunction with the accompanying drawings.

DETAILED DESCRIPTION OF THE INVENTION

Figure 11:
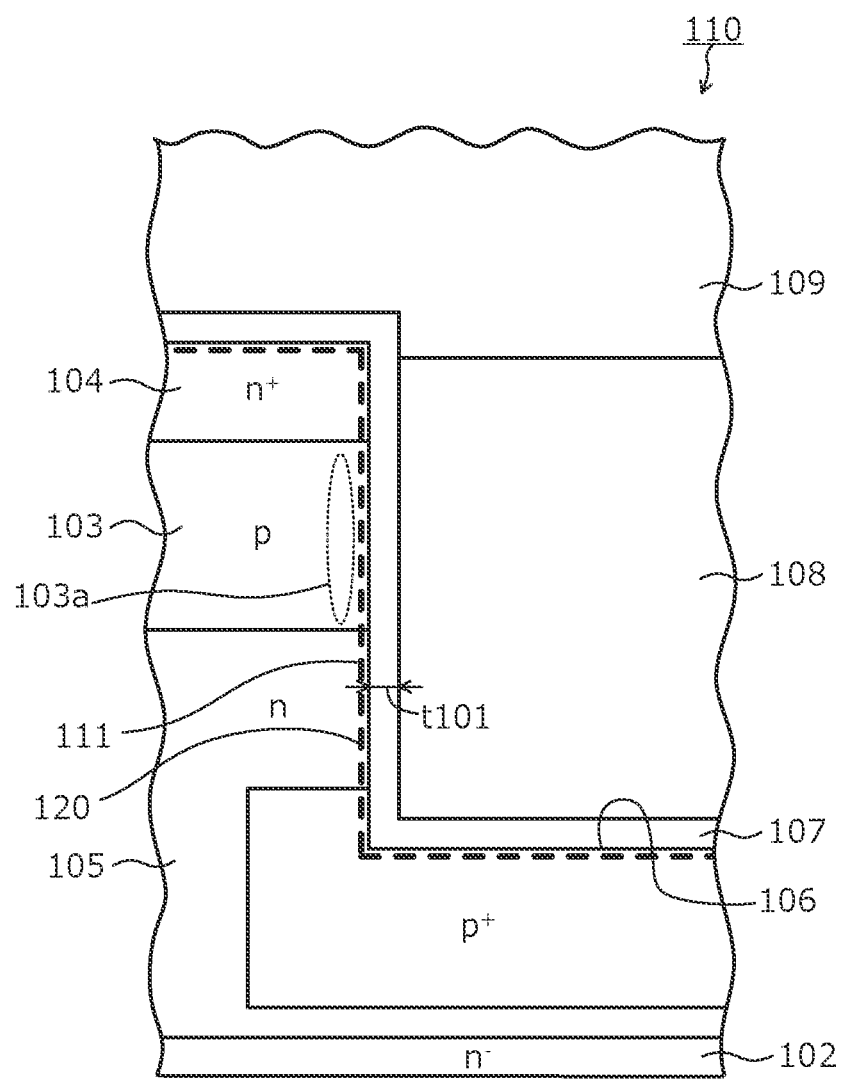
FIG. 11 is a cross-sectional view of a state of a $SiC/SiO_2$ interface of a conventional silicon carbide semiconductor device.

First, problems associated with the conventional techniques are discussed. In an instance in which the gate insulating films (HTO film) are deposited by a general HTO method performed normally, a gas (for example, $N_2O$) containing oxygen (O) as a source gas is used and therefore, at the start of deposition of the HTO films, the SiC surface is briefly oxidized. While oxidation of the SiC surface by the HTO is an extremely small amount at the $SiC/SiO_2$ interface, it causes precipitation of excess carbon (carbon cluster). FIG. 11 is a cross-sectional view of a state of a $SiC/SiO_2$ interface of a conventional silicon carbide semiconductor device.

In a conventional silicon carbide semiconductor device 110 depicted in FIG. 11, when a HTO film 107 that forms a gate insulating film at an inner wall of a trench 106 is deposited, the inner wall (SiC surface) of the trench 106 is oxidized very shallowly, thereby forming a $SiO_2$ film 111 (indicated by bold dashed line) between the inner wall of the trench 106 and the HTO film 107. Further, excess carbon occurs near a bonding interface ($SiC/SiO_2$ interface) 120 between the inner wall of the trench 106 and the $SiO_2$ film 111.

To further improve element characteristics, it is important not to oxidize the sidewalls of the trench 106 at a portion of the inner wall of the trench 106 where a p-type base region 103 exposed, however, in the conventional method, oxidation of the SiC surface at the start of the deposition of the HTO film cannot be completely suppressed. Reference numerals 102, 104, 105, 108, and 109 are an n⁻-type drift region, an n⁺-type source region, an n-type current spreading region, a gate electrode, and a source electrode.

In Japanese Patent No. 3893725, SiC bonds are intentionally broken by ion implantation, the resulting carbon is converted to an oxocarbon (CO or $CO_2$) and released externally while the remaining Si is oxidized to form gate insulating films having a low carbon content, however, to break the SiC bonds, the ion implantation is performed using high acceleration energy. Therefore, the SiC crystal structure of the p-type region, at the portion thereof where a channel (n-type inversion layer) is formed is disturbed and may adversely affect electrical characteristics and reliability.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
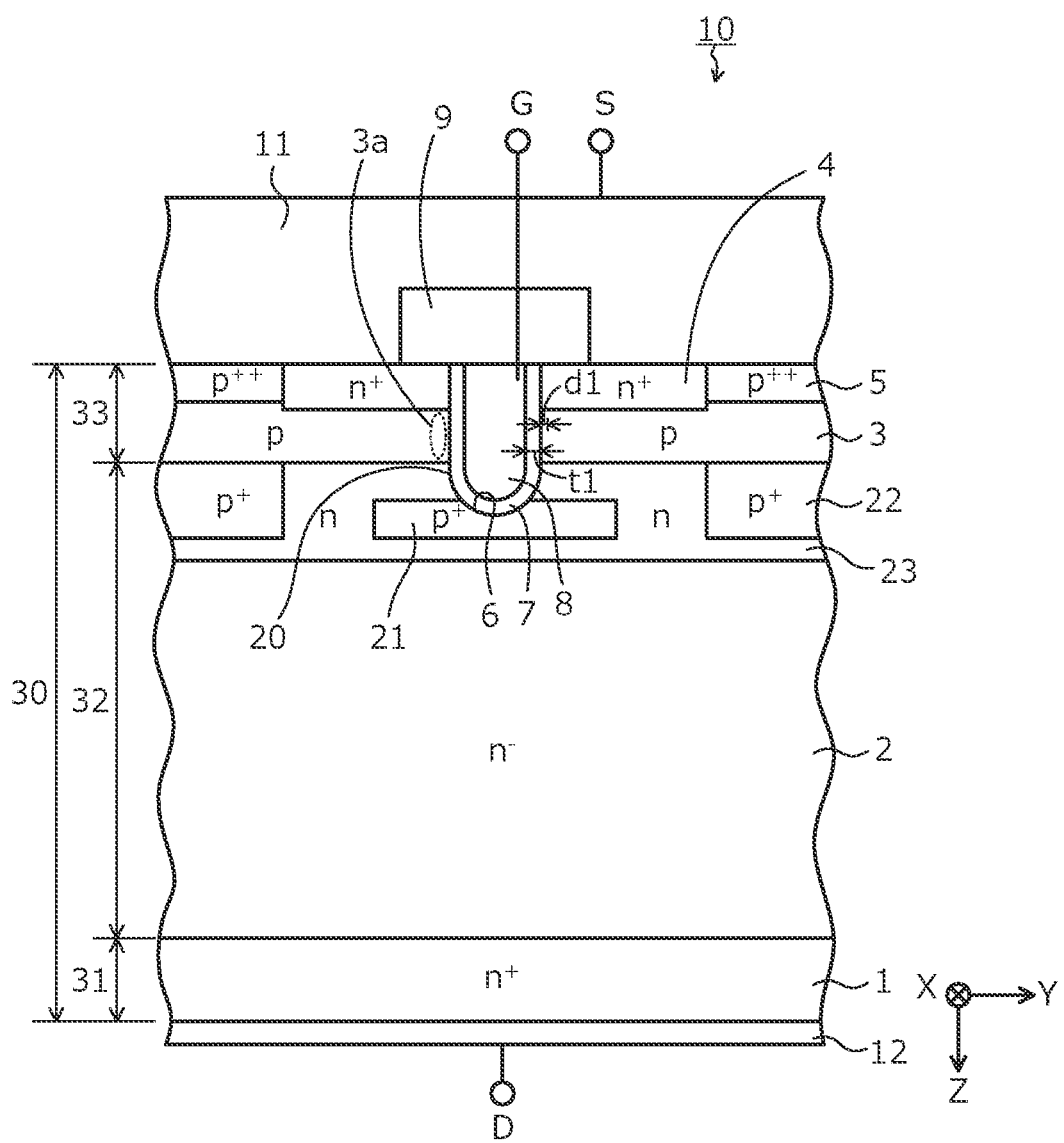
FIG. 1 is a cross-sectional view of a structure of a silicon carbide semiconductor device according to an embodiment.

A structure of a silicon carbide semiconductor device according to an embodiment is described. FIG. 1 is a cross-sectional view of the structure of the silicon carbide semiconductor device according to the embodiment. A silicon carbide semiconductor device 10 according to the embodiment depicted in FIG. 1 is a vertical MOSFET having a trench gate structure on a front surface of a semiconductor substrate (semiconductor chip) 30 containing silicon carbide (SiC) as a semiconductor material. The semiconductor substrate 30 is formed by sequentially depositing, on a front surface of an n⁺-type starting substrate 31 containing SiC as a semiconductor material, epitaxial layers 32, 33 that form an n⁻-type drift region (first semiconductor region) 2 and p-type base regions (second semiconductor region) 3.

A main surface of the semiconductor substrate 30 on a side thereof having the p-type epitaxial layer 33 is a front surface (first main surface) thereof and a main surface of the semiconductor substrate 30 on a side thereof having the n⁺-type starting substrate 31 is a back surface (second main surface) of the semiconductor substrate 30 (back surface of the n⁺-type starting substrate 31). The n⁺-type starting substrate 31 is an n⁺-type drain region 1. The n⁻-type drift region 2 is a portion of the n⁻-type epitaxial layer 32 facing the n⁺-type starting substrate 31 and adjacent to the n⁺-type starting substrate 31 in a depth direction Z. The p-type base regions 3 are provided between the front surface of the semiconductor substrate 30 and the n⁻-type drift region 2. An n-type current spreading region 23 is provided between and in contact with the n⁻-type drift region 2 and the p-type base regions 3.

The n-type current spreading region 2 is a so-called current spreading layer (CSL) that reduces carrier spreading resistance. The n-type current spreading region 23 is exposed at sidewalls of trenches 6 and in contact with gate insulating films 7. The n-type current spreading region 23 may be omitted. In this instance, the p-type base regions 3 and the n⁻-type drift region 2 are adjacent to one another in the depth direction Z and the n⁻-type drift region 2 is exposed at the sidewalls of the trenches 6. Further, p⁺-type regions 21, 22 described hereinafter are selectively provided in the n⁻-type drift region 2. In the n-type current spreading region 23, the p⁺-type regions 21, 22 are selectively provided separate from one another.

The p⁺-type regions 21, 22 are fixed at a source potential of a source electrode 11 described hereinafter and have a function of mitigating electric field applied to bottoms of the later-described trenches 6, when the MOSFET is OFF and the n-type current spreading region 23 depletes. The p+-type region 21 is provided in plural separate from the p-type base regions 3, each of the p+-type regions 21 facing a bottom of a different trench 6 of the trenches 6 in the depth direction Z. The p+-type regions 21 are exposed at the bottoms and bottom corner portions of the trenches 6. The bottom corner portions of the trenches 6 are connecting portions between the bottoms and the sidewalls of the trenches 6. The p+-type regions 22 are provided between adjacent trenches 6 of the trenches 6, separate from the trenches 6 and the p+-type regions 21, and in contact with the p-type base regions 3.

The trenches 6 penetrate the p-type epitaxial layer 33 in the depth direction Z from the front surface of the semiconductor substrate 30, reach the n-type current spreading region 23 (in an instance in which the n-type current spreading region 23 is not provided, the n−-type drift region 2), and terminate in the p+-type regions 21. The trenches 6, for example, extend in a striped pattern in a first direction X parallel to the front surface of the semiconductor substrate 30. At the sidewalls of the trenches 6, sequentially from the front surface of the semiconductor substrate 30 toward the back surface, n+-type source regions (third semiconductor regions) 4 described hereinafter, the p-type base regions 3 described hereinafter, the n-type current spreading region 23, and the p+-type regions 21 are exposed. In the trenches 6, gate electrodes 8 are provided via the gate insulating films 7.

The gate insulating films 7 are silicon oxide ($SiO_2$) films (hereinafter, HTO films) formed by deposition of a HTO. Amounts of carbon (C) atoms near bonding interfaces ($SiC/SiO_2$ interface) 20 between inner walls of the trenches 6 and the gate insulating films 7 and contained in the gate insulating films 7 are low compared to amounts thereof in the conventional structure (refer to FIG. 10). The amount of carbon atoms contained in the gate insulating films 7 is at most ⅕ of the amount (50 at %) of carbon atoms based on a composition of the semiconductor substrate 30 (SiC) and, for example, is at most about 10 at %. A thickness t1 of the gate insulating films 7, for example, is about 60 nm and is uniform spanning an entire area of the inner walls of the trenches 6. The thickness being uniform means that the thickness is substantially the same and in a range that includes allowable error due to process variation.

Between adjacent trenches 6 of the trenches 6, the n+-type source regions 4 and p++-type connect regions 5 described hereinafter are selectively provided in the p-type epitaxial layer 33. The n+-type source regions 4 and the p++-type connect regions 5 extend in a linear shape in the first direction X in which the trenches 6 extend (not depicted). In FIG. 1, while only one unit cell (configuration unit of an element) of the silicon carbide semiconductor device 10 according to the embodiment is depicted, adjacent to the depicted unit cell, unit cells having the same structure are repeatedly disposed in a second direction Y parallel to the front surface of the semiconductor substrate 30 and orthogonal to the first direction X.

The n+-type source regions 4 and the p++-type connect regions 5 are selectively provided between the front surface of the semiconductor substrate 30 and the p-type base regions 3, and are exposed at the front surface of the semiconductor substrate 30. The n+-type source regions 4 are provided closer to the trenches 6 than are the p++-type connect regions 5 and are in contact with the gate insulating films 7 at the sidewalls of the trenches 6. The p-type base regions 3 may be exposed at the front surface of the semiconductor substrate 30 without providing the p++-type connect regions 5. Portions of the p-type epitaxial layer 33 excluding the n+-type source regions 4 and the p++-type connect regions 5 and facing a drain electrode 12 are the p-type base regions 3.

In the p-type base regions 3, in portions (high-oxygen-concentration regions) thereof extending from the sidewalls of the trenches 6 in the second direction Y orthogonal to the sidewalls of the trenches 6 and spanning a distance (hereinafter, simply "distance from the sidewalls of the trenches 6") dl (refer to FIGS. 1, 7) that is at most about half of the thickness t1 of the gate insulating films 7 (in particular, at most about 30 nm) and that may be in a range from about 20 nm to 25 nm, an oxygen (O) concentration is higher than a normal oxygen concentration of the semiconductor substrate 30. The normal oxygen concentration of the semiconductor substrate 30 is an impurity concentration of oxygen contained in the epitaxial layers 32, 33 by general epitaxial growth alone and, for example, is about $1\times10^{15}/cm^3$.

In particular, the oxygen concentration of the p-type base regions 3 exhibits a peak concentration (maximum value) at contact surfaces (surfaces of the sidewalls of the trenches 6) between the p-type base regions 3 and the gate insulating films 7 in contact with one another and decreases steeply with increasing distance from the sidewalls of the trenches 6 in the second direction Y orthogonal to the sidewalls of the trenches 6, to the normal oxygen concentration of the semiconductor substrate 30. The maximum value of the oxygen concentration of the p-type base regions 3, for example, is in a range from about $5\times10^{17}/cm^3$ to $1\times10^{20}/cm^3$. When the maximum value of the oxygen concentration of the p-type base regions 3 is at least equal to the lower limit, an effect of reduced excess carbon is obtained. When the maximum value of the oxygen concentration of the p-type base regions 3 exceeds the upper limit, the semiconductor substrate 30 contains impurity atoms in excess, adversely affecting element characteristics.

An oxygen concentration distribution of the portions of the p-type base regions 3 spanning the distance dl from the sidewalls of the trenches 6 is affected by later-described oblique ion implantations 43, 44 of oxygen (refer to FIGS. 5, 6) into the sidewalls of the trenches 6, performed after the formation of the trenches 6 and before the formation of the gate insulating films 7. During the oblique ion implantations 43, 44, oxygen is introduced from the sidewalls of the trenches 6 into the n-type current spreading region 23 directly beneath (in the depth direction Z) the p-type base regions 3. As a result, the oxygen concentration distribution of the n-type current spreading region 23, spanning the distance dl from the sidewalls of the trenches 6 is equal to the oxygen concentration distribution of the p-type base regions 3, spanning the distance dl from the sidewalls of the trenches 6. Oxygen may be further introduced from the sidewalls of the trenches 6 into the n+-type source regions 4 at portions thereof toward the drain electrode 12.

Figure 7:
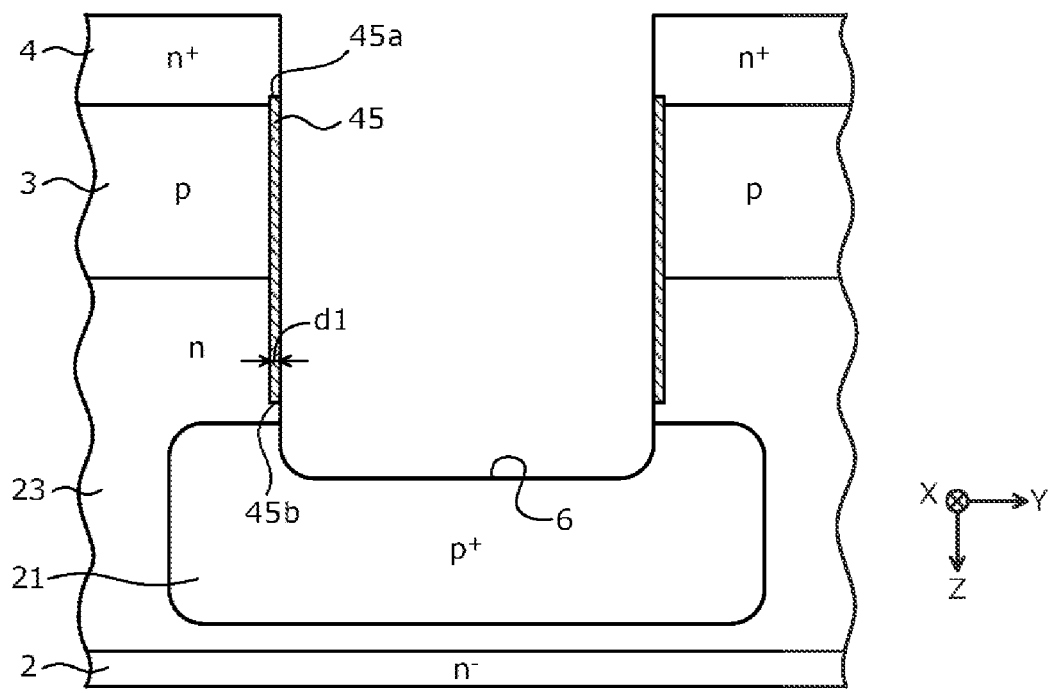
FIG. 7 is a cross-sectional view of a state of the silicon carbide semiconductor device according to the embodiment during manufacture.

In the sidewalls of the trenches 6, in portions thereof where oxygen is introduced (portions in which an oxygen ion-implanted layer 45 is formed, refer to FIG. 7), the crystal structure is disturbed by the oblique ion implantations 43, 44 in a state in which the SiC crystal structure is retained as much as possible (SiC bonds are not broken as much as possible). In the sidewalls of the trenches 6, at portions thereof having the n+-type source regions 4, upper corner portions of the trenches 6, and bottom corner portions of the trenches 6, oxygen is substantially not introduced by the oblique ion implantations 43, 44 and therefore, the oxygen concentration of these portions is equal to the normal oxygen concentration of the semiconductor substrate 30.

The upper corner portions of the trenches 6 are connecting portions between the front surface of the semiconductor substrate 30 and the side surfaces of the trenches 6.

An interlayer insulating film 9 is provided in an entire area of the front surface of the semiconductor substrate 30 and covers the gate electrodes 8. In contact holes of the interlayer insulating film 9, the $n^+$-type source regions 4 and the $p^{++}$-type connect regions 5 are exposed. The source electrode (first electrode) 11 is in ohmic contact with the $n^+$-type source regions 4 and the $p^{++}$-type connect regions 5 via the contact holes of the interlayer insulating film 9 and is electrically connected to these regions and the p-type base regions 3. In an instance in which the $p^{++}$-type connect regions 5 are not provided, the source electrode 11 is in ohmic contact with the p-type base regions 3 instead of the $p^{++}$-type connect regions 5, in the contact holes of the interlayer insulating film 9.

The drain electrode (second electrode) 12 is provided on an entire area of the back surface (back surface of the $n^+$-type starting substrate 31) of the semiconductor substrate 30. The drain electrode 12 is in contact with the $n^+$-type drain region 1 (the $n^+$-type starting substrate 31) and is electrically connected to the $n^+$-type drain region 1.

Figure 2:
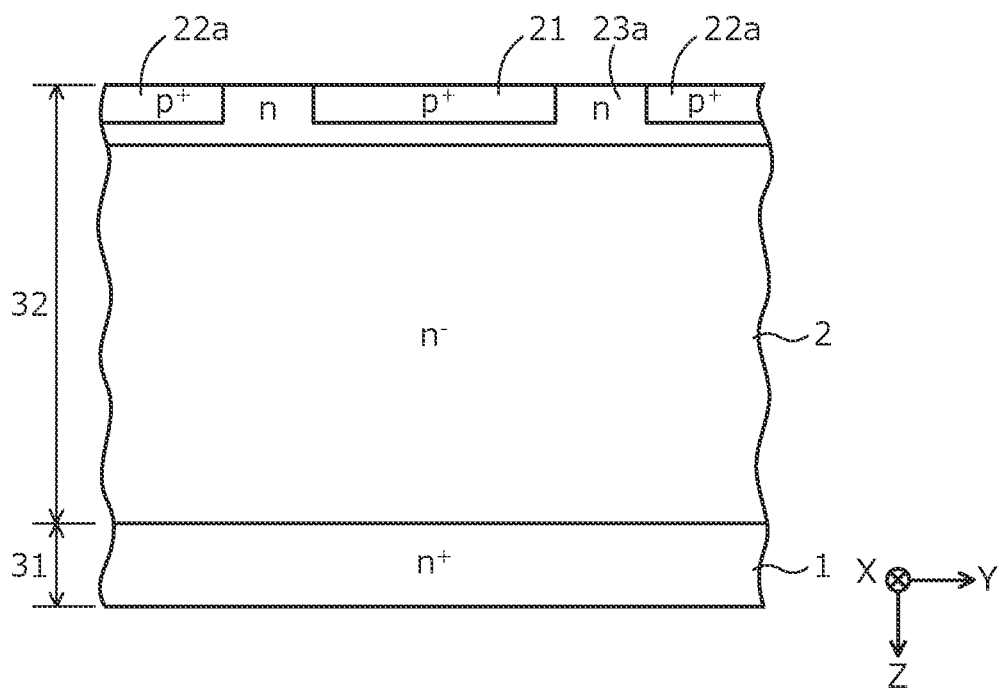
FIG. 2 is a cross-sectional view of a state of the silicon carbide semiconductor device according to the embodiment during manufacture.

Next, a method of manufacturing the silicon carbide semiconductor device 10 according to the embodiment is described. FIGS. 2, 3, 4, 5, 6, 7 and 8 are cross-sectional views of states of the silicon carbide semiconductor device according to the embodiment during manufacture. FIGS. 5 to 8 depict enlarged views of a vicinity of one of the trenches 6. First, as depicted in FIG. 2, on the front surface of the $n^+$-type starting substrate (semiconductor wafer) 31 containing silicon carbide as a semiconductor material, the $n^-$-type epitaxial layer 32 forming the $n^-$-type drift region 2 is formed by epitaxial growth.

Next, the $p^+$-type regions 21 and the $p^+$-type regions 22a are each selectively formed in surface regions of the $n^-$-type epitaxial layer 32, so as to be disposed separate from and repeatedly alternating one another in the second direction Y. Next, in surface regions of the $n^-$-type epitaxial layer 32, n-type regions 23a are formed between the $p^+$-type regions 21 and the $p^+$-type regions 22a adjacent to one another. A portion of the $n^-$-type epitaxial layer 32 closer to the $n^+$-type starting substrate 31 than are the $p^+$-type regions 21, 22a and the n-type regions 23a forms the $n^-$-type drift region 2.

Figure 3:
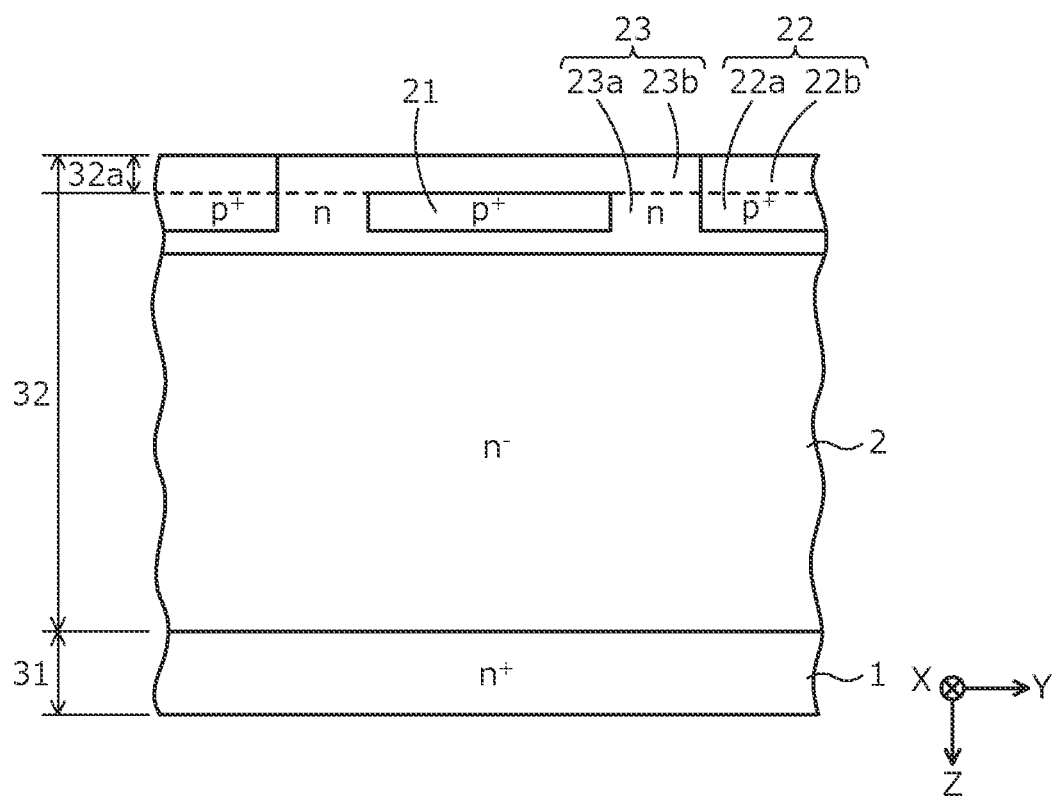
FIG. 3 is a cross-sectional view of a state of the silicon carbide semiconductor device according to the embodiment during manufacture.

Next, as depicted in FIG. 3, the thickness of the $n^-$-type epitaxial layer 32 is increased to a predetermined thickness by epitaxial growth. Next, in a portion 32a increasing the thickness of the $n^-$-type epitaxial layer 32, the $p^+$-type regions 22b are selectively formed and are respectively connected to the $p^+$-type regions 22a adjacent thereto in the depth direction Z, whereby the $p^+$-type regions 22 are formed. Next, in the portion 32a increasing the thickness of the $n^-$-type epitaxial layer 32, n-type regions 23b are formed and respectively connected to the n-type regions 23a adjacent thereto in the depth direction Z, whereby the n-type current spreading region 23 is formed.

Figure 4:
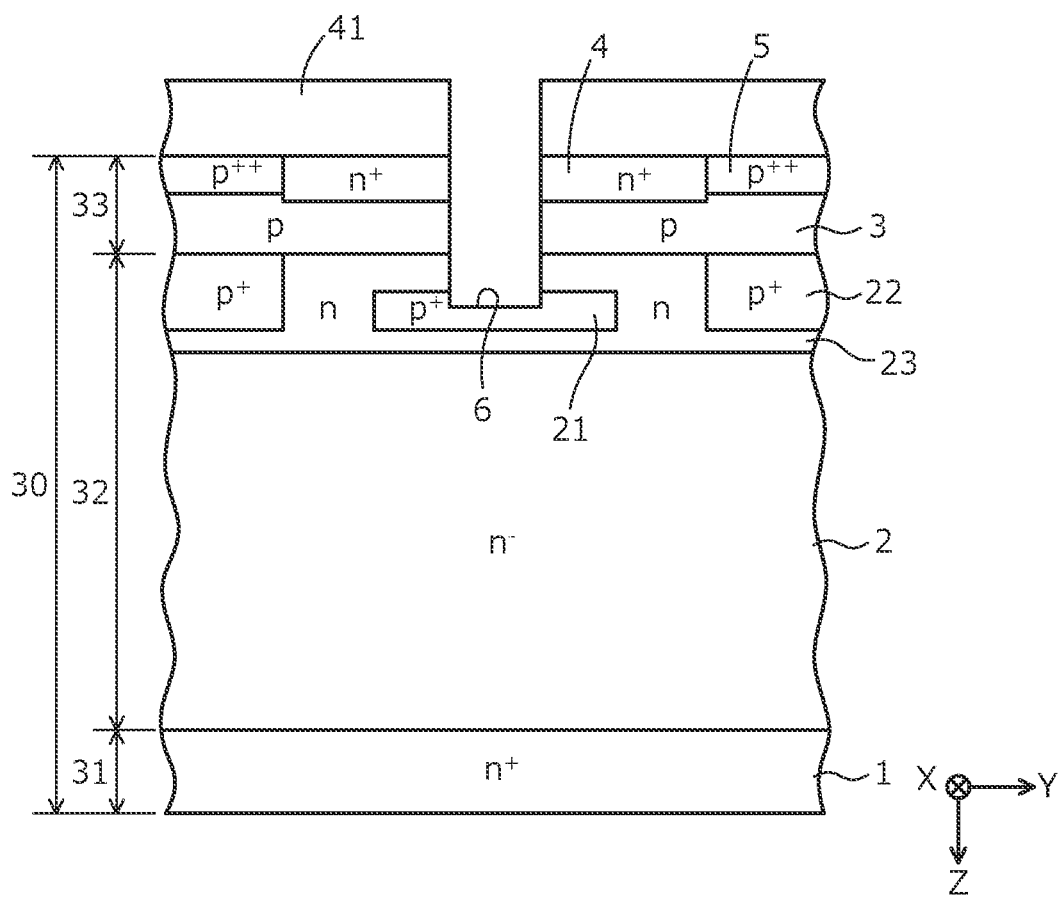
FIG. 4 is a cross-sectional view of a state of the silicon carbide semiconductor device according to the embodiment during manufacture.

Next, as depicted in FIG. 4, on the $n^-$-type epitaxial layer 32, the p-type epitaxial layer 33 that forms the p-type base regions 3 is formed by epitaxial growth, whereby the semiconductor substrate (semiconductor wafer) 30 is fabricated. Next, in surface regions of the p-type epitaxial layer 33, the $n^+$-type source regions 4 and the $p^{++}$-type connect regions 5 are selectively formed. Portions of the p-type epitaxial layer 33 closer to the $n^-$-type epitaxial layer 32 than are the $n^+$-type source regions 4 and the $p^{++}$-type connect regions 5 form the p-type base regions 3.

Figure 5:
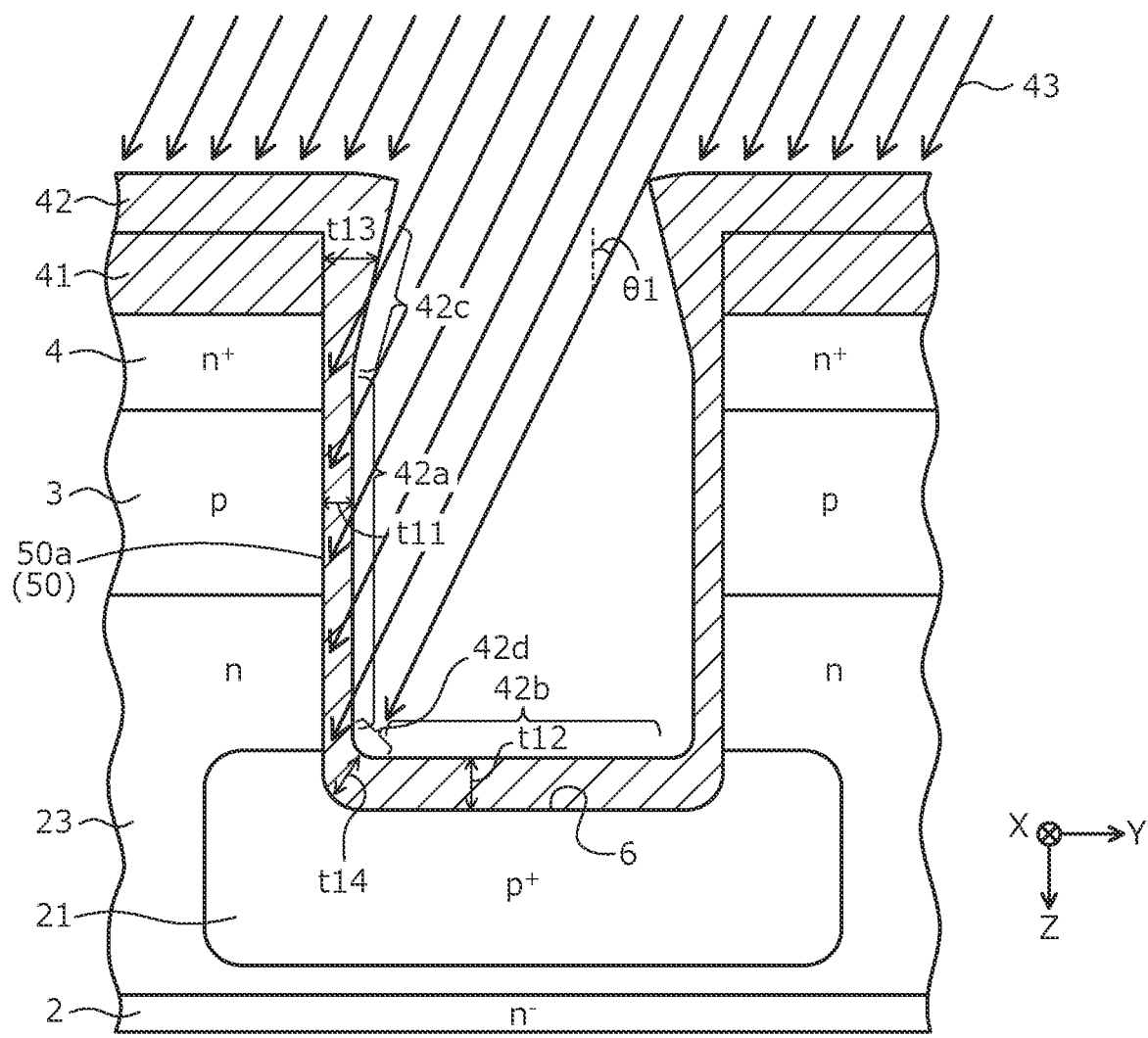
FIG. 5 is a cross-sectional view of a state of the silicon carbide semiconductor device according to the embodiment during manufacture.

Next, an oxide film ($SiO_2$ film) mask (first oxide film mask) 41 having openings at portions corresponding to formation regions of the trenches 6 is formed on the front surface of the semiconductor substrate 30 (first process). Next, etching is performed using the oxide film mask 41 as a mask to form the trenches 6 that penetrate the $n^+$-type source regions 4 and the p-type base regions 3, reach the n-type current spreading region 23, and terminate in the $p^+$-type regions 21 (second process). Next, as depicted in FIG. 5, with the oxide film mask 41 as is, along the surface of the oxide film mask 41 and the inner walls of the trenches 6, an oxide film ($SiO_2$ film) mask (second oxide film mask) 42 is formed (third process). The oxide film masks 41, 42 form screen oxide films (protective films) that protect the inner walls of the trenches 6 during the oblique ion implantations 43, 44 described hereinafter.

First portions 42a of the oxide film mask 42 cover portions of the p-type base regions 3 where channels 3a (refer to FIG. 1) are formed. The first portions 42a of the oxide film mask 42 may cover the p-type base regions 3 and the n-type current spreading region 23 (refer to FIGS. 5, 6). A thickness t11 of the first portions 42a of the oxide film mask 42, for example, is about 25 mm. In the oxide film mask 42, thicknesses t12, t13, t14 of second portions, third portions, and fourth portions thereof 42b, 42c, 42d excluding the first portions 42a are greater than the thickness t11 of the first portions 42a. For example, in the oxide film mask 42, the thickness t12 of the second portions 42b covering the bottoms of the trenches 6 is about 45 nm.

The oxide film mask 42, for example, may be formed by plasma CVD. As a result, the oxide film mask 42 may be formed by a low temperature (for example, about 300 degrees C.) and therefore, during formation of the oxide film mask 42, the inner walls (SiC surfaces) of the trenches 6 are not oxidized. Further, in the oxide film mask 42, the thicknesses t12 to t14 of the second to the fourth portions 42b to 42d may be set naturally to be greater than the thickness t11 of the first portions 42a and may be set to be thicknesses capable of blocking the oxygen during the oblique ion implantations 43, 44.

In the oxide film mask 42, the thickness t12 of the second portions 42b covering the bottoms of the trenches 6, the thickness t13 of the third portions 42c covering the upper corner portions of the trenches 6 and the $n^+$-type source regions 4, and the thickness t14 of the fourth portions 42d covering the bottom corner portions of the trenches 6 are increased, thereby enabling prevention of the introduction of oxygen into the $n^+$-type source regions 4, the $p^{++}$-type connect regions 5, and the $p^+$-type regions 21 during the oblique ion implantations 43, 44. Portions of the $n^+$-type source regions 4 toward the drain electrode 12 may be covered by the first portions 42a of the oxide film mask 42.

Next, using the oxide film masks 41, 42 as a mask, ion implantation (hereinafter, oblique ion implantation) 43 of oxygen into first sidewalls of the trenches 6 is performed from an oblique direction of a predetermined implantation angle (tilt angle) θ1 relative to a direction (the depth direction Z) orthogonal to the front surface of the semiconductor substrate 30 (fourth process). As a result, through the first portions 42a of the oxide film mask 42, oxygen is introduced from the first sidewalls of the trenches 6 into the p-type base regions 3 and the n-type current spreading region 23. In the first sidewalls of the trenches 6, at portions thereof covered by the second to the fourth portions 42b to 42d of the oxide film mask 42, oxygen is not introduced.

Figure 6:
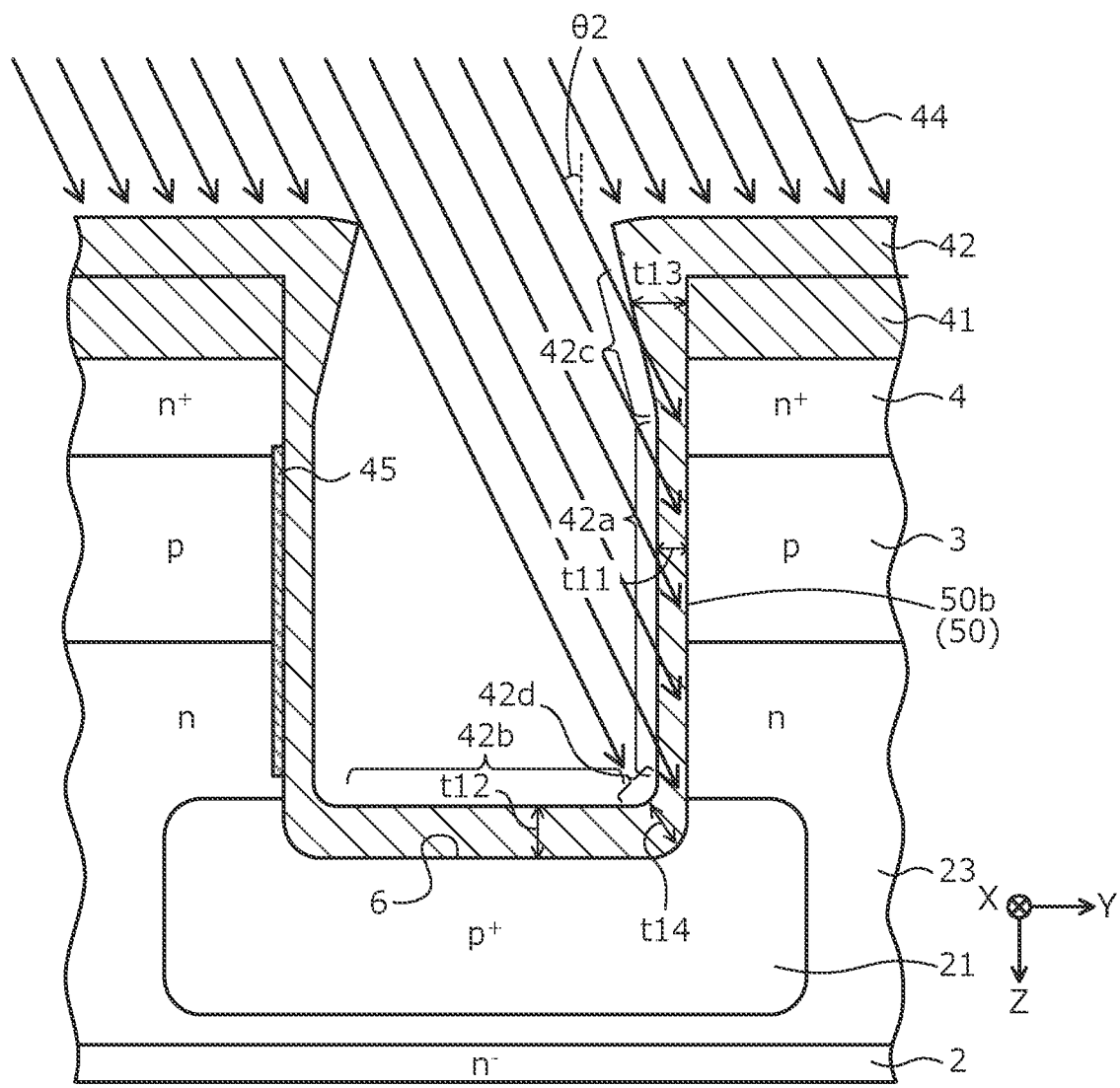
FIG. 6 is a cross-sectional view of a state of the silicon carbide semiconductor device according to the embodiment during manufacture.

Next, as depicted in FIG. 6, using the oxide film masks 41, 42 as a mask, the oblique ion implantation 44 of oxygen into second sidewalls of the trenches 6 is performed from an oblique direction of a predetermined implantation angle (tilt angle) θ2 relative to a direction orthogonal to the front surface of the semiconductor substrate 30 (fourth process). As a result, through the first portions 42a of the oxide film mask 42, oxygen is introduced from the second sidewalls of the trenches 6 into the p-type base regions 3 and the n-type current spreading region 23. In the second sidewalls of the trenches 6, at portions thereof covered by the second to the fourth portions 42b to 42d of the oxide film mask 42, oxygen is not introduced.

The implantation angle θ2 of the oblique ion implantation 44 to the second sidewalls of the trenches 6 has linear symmetry with the implantation angle θ1 of the oblique ion implantation 43 to the first sidewalls of the trenches 6 around, as axes, center axes of the trenches 6, orthogonal to the front surface of the semiconductor substrate 30. Other than the implantation angle θ2 of the oblique ion implantation 44 to the second sidewalls of the trenches 6, conditions are similar to those of the oblique ion implantation 43 to the first sidewalls of the trenches 6. Further, in both the oblique ion implantations 43, 44, oxygen is not introduced from the front surface of the semiconductor substrate 30 covered by the oxide film masks 41, 42.

The oblique ion implantations 43, 44, for example, are performed in a state of heating the semiconductor substrate 30 to about 500 degrees C., using a general ion implantation apparatus. The implantation angles θ1, θ2 of the oblique ion implantations 43, 44, for example, are about 30 degrees relative to a direction orthogonal to the front surface of the semiconductor substrate 30. Depth positions (distance from the surface of the oxide film mask 42 (ion implantation surface) in the second direction Y orthogonal to the sidewalls of the trenches 6) of ranges of the oblique ion implantations 43, 44 are set to be within the oxide film mask 4. Therefore, a position (hereinafter, peak position) 51a of the peak concentration of an oxygen concentration distribution 51 (refer to FIG. 9) resulting from the oblique ion implantations 43, 44 is within the oxide film mask 42.

Acceleration energy of the oblique ion implantations 43, 44 retains the SiC crystal structure as much as possible and, for example, is at most about 50 keV or may be at most about 30 keV. The greater is the acceleration energy of the oblique ion implantations 43, 44, the higher is the peak concentration of the oxygen concentration distribution 51 and the greater the oxygen amount near the sidewalls of the trenches 6 may be; however, damage occurs due to the oblique ion implantations 43, 44. Therefore, the oblique ion implantations 43, 44 are performed by low acceleration energy in the range described above to minimize damage to the SiC crystal structure.

A dose amount of the oblique ion implantations 43, 44, for example, is in a range from about $5 \times 10^{12}/cm^2$ to $5 \times 10^{14}/cm^2$. The lower is the dose amount of the oblique ion implantations 43, 44, the shallower the distance dl from the sidewalls of the trenches 6 may be for the oxygen concentration distribution 51 and the greater the amount of oxygen may be introduced near the sidewalls of the trenches 6. As a result, even when the oblique ion implantations 43, 44 are performed by low acceleration energy, near the sidewalls of the trenches 6, excess carbon may be reduced and oxygen that contributes to oxygen defect repair may be increased.

For example, the oblique ion implantations 43, 44 are performed with the acceleration energy set to 10 keV, which is the lower limit value for a general ion implantation apparatus and the dose amount is set to $5 \times 10^{12}/cm^2$. Under these conditions, positions respectively 5 nm from interfaces (hereinafter, SiC/mask $SiO_2$ interfaces) 50 between the inner walls (in FIGS. 5 and 6, respective sidewalls of the trenches 6, respectively indicated by reference characters 50a, 50b) of the trenches 6 and the oxide film mask 42, in a direction orthogonal to the SiC/mask $SiO_2$ interfaces 50 toward the oxide film mask 42 are set as depth positions of the range (the peak position 51a of the oxygen concentration distribution 51) and oxygen is introduced into surface regions of the sidewalls of the trenches 6 (refer to FIG. 9).

The dose amount of the oblique ion implantations 43, 44 is adjusted according to the amount of excess carbon that occurs at the start of deposition of the HTO films of the gate insulating films 7, in an instance in which the oblique ion implantations 43, 44 are not performed. This amount of excess carbon varies according to deposition conditions for the HTO films forming the gate insulating films 7, the HTO apparatus, etc. and therefore, the amount of excess carbon is obtained in advance and the dose amount of the oblique ion implantations 43, 44 is adjusted. An instance in which the oblique ion implantations 43, 44 are not performed is an instance in which in the conventional silicon carbide semiconductor device 110 (refer to FIG. 11), the HTO films 107 that form the gate insulating films are deposited on the inner walls of the trenches 106.

In particular, for example, as described hereinafter, by EDX, a mass concentration profile of the silicon element, the oxygen element, and the carbon element of the bonding interface ($SiO_2$/SiC interface) 120 between the inner walls of the trenches 106 and the $SiO_2$ film 111 is obtained (refer to FIG. 10). In this mass concentration profile, based on the amount of carbon decrease in an interface segment 60 from a start 61 of decrease of the carbon concentration to an end 62 of increase of the oxygen concentration, the dose amount of the oblique ion implantations 43, 44 is adjusted so that, after the oblique ion implantations 43, 44, an end 63 of decrease of the carbon concentration and a start 64 of increase of the oxygen concentration transition toward the SiC side.

By the oblique ion implantations 43, 44 described above, as depicted in FIG. 7, in the p-type base regions 3 and the n-type current spreading region 23, along the sidewalls of the trenches 6, the oxygen ion-implanted layers 45 that terminate at the predetermined distance dl from the sidewalls of the trenches 6 are formed. The oxygen ion-implanted layers 45 each have a first end 45a and a second end 45b apart from the first end 45a in the depth direction Z. The first end 45a is located at a position apart from the first main surface of the semiconductor substrate 30 in the depth direction Z. The second end 45b is located at a position closer to the first main surface of the semiconductor substrate 30 than is a bottom of the trenches 6. Further, for example, the oxide film masks 41, 42 are removed by hydrogen fluoride (HF) (fifth process). After removal of the oxide film mask 42, the oxygen concentration distribution 51 of the oxygen ion-implanted layers 45 remains only in the semiconductor substrate 30. A new peak position 51a' of the oxygen concentration distribution 51 of the oxygen ion-implanted layers 45 is at the surface of the sidewalls of the trenches 6 (refer to FIG. 9).

Further, the oxygen ion-implanted layers 45 having the oxygen concentration distribution 51 that decreases steeply with increasing distance from the sidewalls of the trenches 6 in the second direction Y orthogonal to the sidewalls of the trenches 6 are formed and the distance dl from the sidewalls of the trenches 6 is reduced in the range described above. As a result, damage of the SiC crystal structure by the oblique ion implantations 43, 44 is reduced. The epitaxial layers 32, 33 contain oxygen at the normal oxygen concentration described above and therefore, during formation of the oxygen ion-implanted layers 45, the amount of oxygen that passes through the oxide film mask 42 and is ion implanted has minimal adverse effects on element characteristics.

Figure 8:
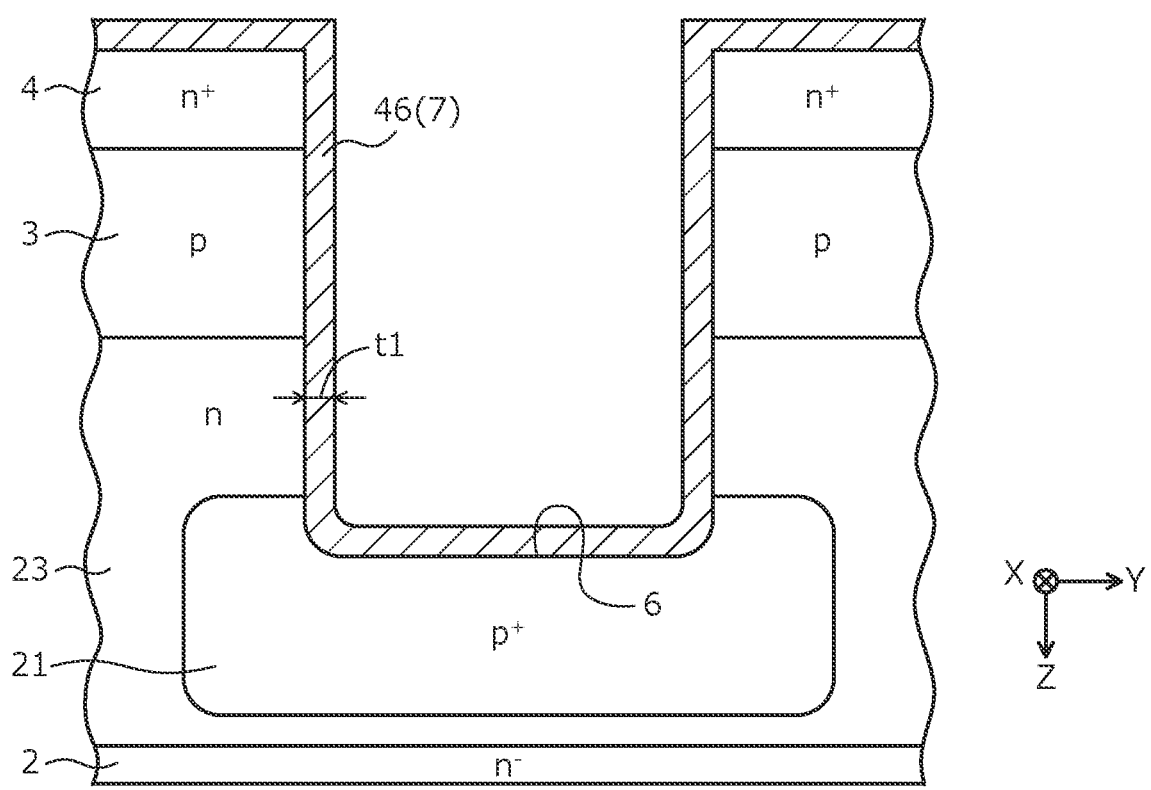
FIG. 8 is a cross-sectional view of a state of the silicon carbide semiconductor device according to the embodiment during manufacture.

Next, as depicted in FIG. 8, $SiO_2$ films (HTO films) 46 that form the gate insulating films 7 are formed by depositing an HTO to have the predetermined thickness t1 (sixth process). In particular, for example, a furnace temperature of the semiconductor substrate 30 is set to 600 degrees C. and about one hour is spent to raise the furnace to about 800 degrees and vacuum, evacuate the furnace. Thereafter, as a source gas, for example, dichlorosilane ((DCS) $SiH_2Cl_2$) gas and a gas containing oxygen (O) (for example, $N_2O$ gas) are introduced into the furnace and, for example, the HTO films 46 are deposited under an atmosphere of a temperature of about 800 degrees C.

At the start of deposition of the HTO films 46, the sidewalls of the trenches 6 (SiC surface) are very thinly oxidized and a very small amount of excess carbon occurs near the $SiC/SiO_2$ interfaces (bonding interfaces between the inner walls of the trenches 6 and the gate insulating films 7) 20; however, this excess carbon reacts with the oxygen in the oxygen ion-implanted layers 45, forms an oxocarbon (CO or $CO_2$), and is desorbed. Bonds between carbon and oxygen occur at a temperature lower than that for forming the HTO films 46 and therefore, during formation of the HTO films 46, excess carbon occurring near the $SiC/SiO_2$ interfaces 20 is eliminated. Further, in the semiconductor substrate 30, oxygen defects near the $SiC/SiO_2$ interfaces 20 are repaired by the oxygen in the oxygen ion-implanted layers 45.

The oxygen in the oxygen ion-implanted layers 45 further diffuses into the HTO films 46, reacts with excess carbon in the HTO films 46, and becomes an oxocarbon. Therefore, excess carbon in the HTO films 46 also becomes an oxocarbon, is desorbed, and removed. Further, by the diffusion of the oxygen in the HTO films 46, oxygen defects in the HTO films 46 are repaired, forming the gate insulating films 7 to have a favorable quality. Further, by oxygen that diffuses from the oxygen ion-implanted layers 45, residual impurities in the HTO films 46 and in the epitaxial layers 32, 33, near the sidewalls of the trenches 6 are oxidized and burned off.

Next, a heat treatment for activating impurities is performed for all diffusion regions formed by ion implantation (the $p^+$-type regions 21, 22, the n-type current spreading region 23, the $n^+$-type source regions 4, and the $p^{++}$-type connect regions 5). The heat treatment for activating the impurities may be performed for each formation of a diffusion region by ion implantation. Next, by a general method, the gate electrodes 8 (seventh process), the interlayer insulating film 9, the source electrode 11, and the drain electrode 12 are formed. Thereafter, the semiconductor wafer (the semiconductor substrate 30) is diced (cut) into individual chips, whereby the silicon carbide semiconductor device 10 depicted in FIG. 1 is completed.

As described above, according to the embodiment, the $SiO_2$ film (HTO film: deposited oxide film) that forms the gate insulating films is formed by a HTO, whereby Si in the SiC of the surfaces of the sidewalls of the trenches does not easily oxidize and compared to an instance in which the $SiO_2$ films (thermal oxide films) that form the gate insulating films are formed by thermal oxidation, the occurrence of excess carbon may be suppressed. Further, according to the embodiment, before the HTO films that form the gate insulating films are formed on the sidewalls of the trenches, in the sidewalls of the trenches, in portions thereof where the p-type base regions are exposed, oxygen is implanted by the oblique ion implantations via the screen oxide film, whereby the oxygen ion-implanted layers are formed.

The oblique ion implantations are performed with a low acceleration energy, a low dose amount, and the range set to be within the screen oxide film. As a result, the oxygen ion-implanted layers exhibit a peak concentration at the surfaces of the sidewalls of the trenches and are formed shallowly in surface regions of the sidewalls of the trenches. The oblique ion implantations are performed by a low acceleration energy in the range described above, whereby damage to the SiC crystal structure is reduced and reliability may be maintained. The oblique ion implantations are performed with a low dose amount in the range described above, whereby oxygen may be increased in shallow portions at the surfaces of the sidewalls of the trenches.

The oxygen implanted by the oblique ion implantations, thereafter, diffuses into the sidewalls of the trenches when the HTO films that form the gate insulating films are deposited, and reacts with the excess carbon in the HTO films and the excess carbon near the $SiC/SiO_2$ interfaces. As a result, the excess carbon becomes an oxocarbon and is desorbed, whereby as compared to an instance in which gate insulating films are formed by an HTO formed by a general method without performing the ion implantation of oxygen, excess carbon near the $SiC/SiO_2$ interfaces and in the HTO films may be reduced. As a result, excess carbon near the channels may be reduced and therefore, electrical characteristics may be improved.

Further, according to the embodiment, when the HTO films that form the gate insulating films are deposited on the sidewalls of the trenches, oxygen defects in surface regions of the sidewalls of the trenches are repaired by the oxygen that diffuses from the oxygen ion-implanted layers. Further, oxygen defects in the HTO films are repaired by the oxygen that diffuse from the oxygen ion-implanted layer and favorable gate insulating films are formed. Further, residual impurities near the sidewalls of the trenches in the epitaxial layers and in the HTO films are oxidized by the oxygen that diffuses from the oxygen ion-implanted layer and are burned off. As a result, the reliability may be improved.

Figure 9:
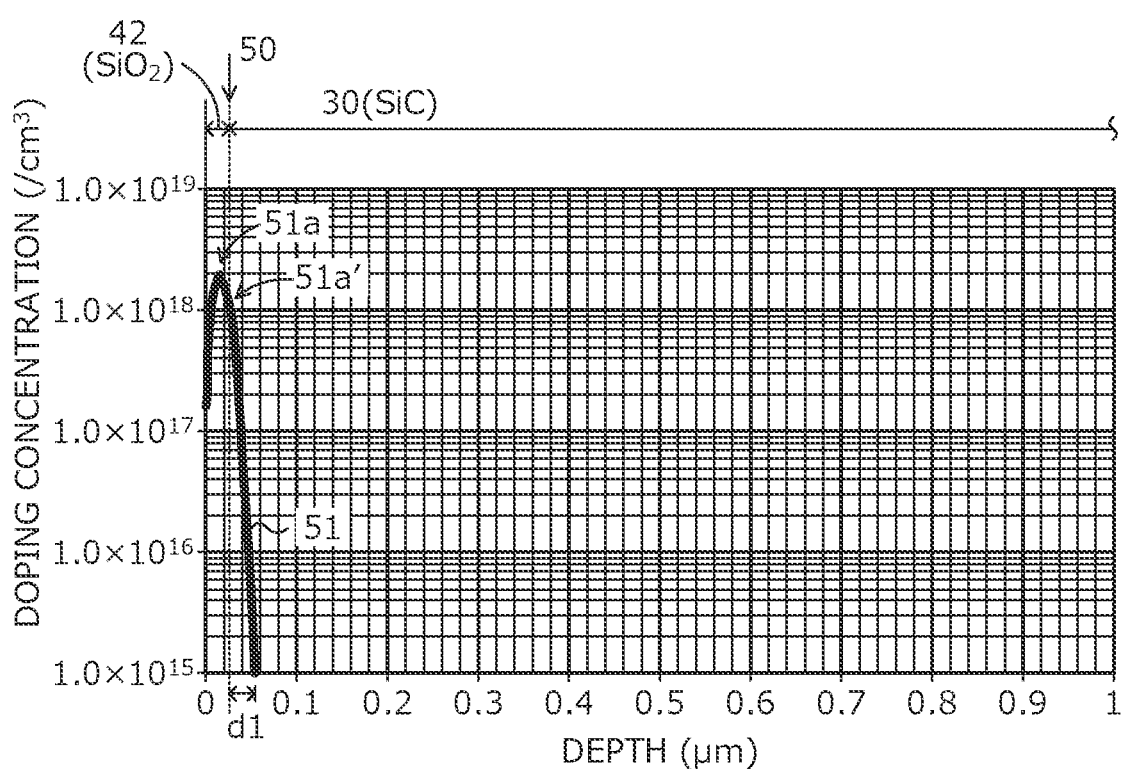
FIG. 9 is a characteristics diagram of oxygen concentration distribution near trench sidewalls in a silicon carbide semiconductor device of an example.

The oxygen concentration distribution 51 of the oxygen ion-implanted layers 45 formed by the oblique ion implantations 43, 44 (refer to FIGS. 5, 6) in the method of manufacturing the silicon carbide semiconductor device 10 according to the embodiment was verified. FIG. 9 is a characteristics diagram of oxygen concentration distribution near trench sidewalls in a silicon carbide semiconductor device of an example. The oxygen concentration distribution 51 of the oxygen ion-implanted layers 45 formed by performing the oblique ion implantations 43, 44 according to the described method of manufacturing the silicon carbide semiconductor device 10 according to the embodiment is depicted in FIG. 9 (hereinafter, example).

As described in the embodiment, the acceleration energy of the oblique ion implantations 43, 44 in the example was set to 10 keV and the dose amount was set to $5 \times 10^{12}/cm^2$. The thickness t11 of the first portions 42a of the oxide film mask 42 that is the screen oxide film (refer to FIGS. 5, 6) was set to 25 nm. From the results depicted in FIG. 9, the oxygen concentration distribution 51 having a position 5 nm from the SiC/mask $SiO_2$ interfaces 50, toward the oxide film mask 42 in a direction orthogonal to the SiC/mask $SiO_2$ interfaces 50 as the peak position 51a was formed by the oblique ion implantations 43, 44.

In the oxygen concentration distribution 51 it was confirmed that, after the removal of the oxide film mask 42, the new peak position 51a' was at the surfaces (the SiC/mask SiO$_2$ interfaces 50) of the sidewalls of the trenches 6 and in the second direction Y orthogonal to the sidewalls of the trenches 6 in the range of at most about 30 nm from the sidewalls of the trenches 6 set for the distance d1, the oxygen concentration decreased steeply with increasing distance from the sidewalls of the trenches 6. Thus, it was confirmed that the oxygen concentration distribution 51 of the oxygen ion-implanted layers 45 may be adjusted by adjusting the acceleration energy and dose amount of the oblique ion implantations 43, 44.

In an experimental example, the conventional silicon carbide semiconductor device 110 (refer to FIG. 11) was taken as an example (hereinafter, conventional example), a width w101 of a segment 60 that corresponds to a channel 103a portion of the SiC/SiO$_2$ interface 120 and that is from the start 61 of decrease of the carbon concentration to the end 62 of increase of the oxygen concentration (hereinafter, interface segment) was verified. Results of mass concentration profiles of the silicon element, the oxygen element, and the carbon element near the SiC/SiO$_2$ interface 120 of the conventional example measured by energy dispersive x-ray spectrometry (EDX) are depicted in FIG. 10.

Figure 10:
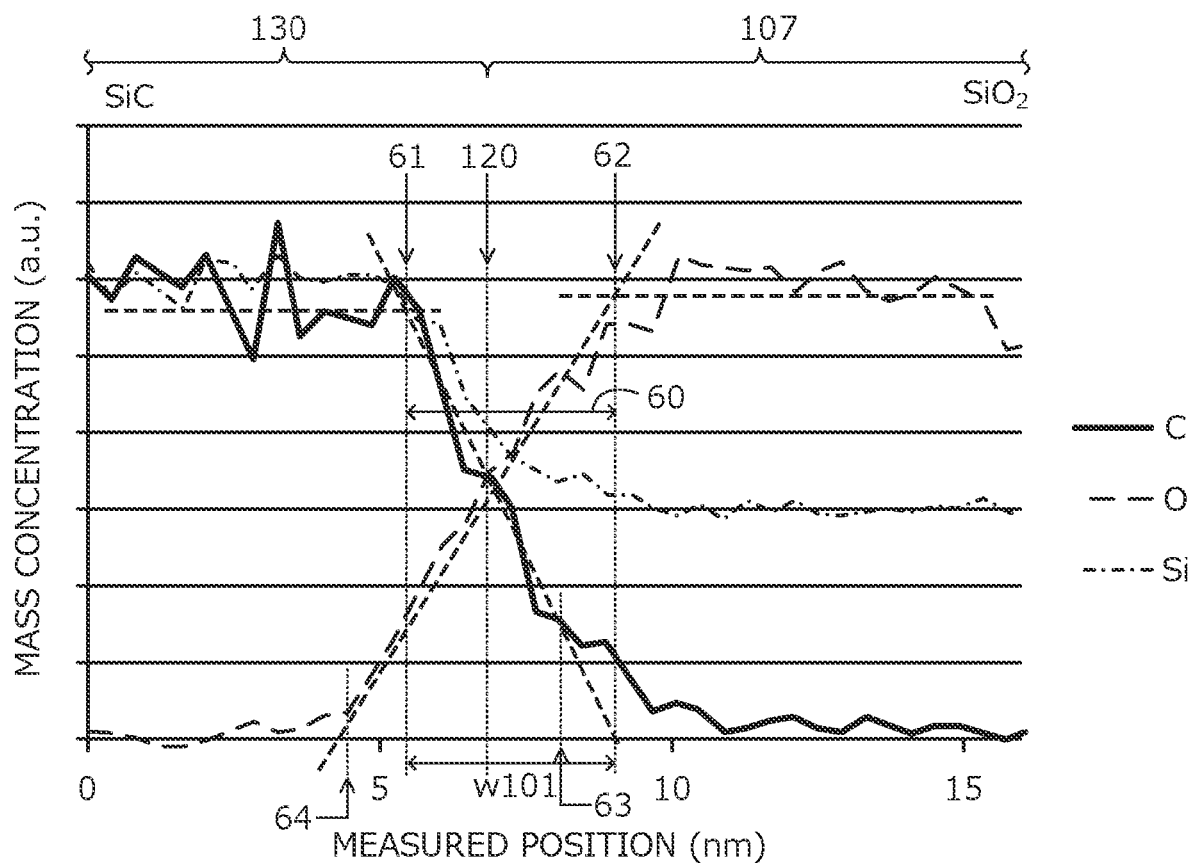
FIG. 10 is a characteristics diagram of element detection ratios near channels of the conventional example.

FIG. 10 is a characteristics diagram of element detection ratios near channels of the conventional example. In FIG. 10, a horizontal axis indicates measured position [nm], the left-hand side being the SiC portion of the sidewalls of the trenches 6 and the right-hand side being the HTO film 107 that forms the gate insulating film. In FIG. 10, a vertical axis indicates mass concentration in an arbitrary unit (a.u.). An intersection of the mass concentration profile of the silicon element and the mass concentration profile of the oxygen element corresponds to the SiC/SiO$_2$ interface 120. The conventional example differs from the example in that the HTO film 107 that forms the gate insulating film is an HTO deposited by a general method performed normally, without performing the oblique ion implantations 43, 44.

The widths w101 of the interface segments 60 of three samples of the conventional example were calculated and an average value of the widths w101 of the interface segments 60 of the conventional example was calculated. For the widths w101 of the interface segments 60 of three samples of the conventional example, measurement values from a 30-degree incline relative to a direction orthogonal to the SiC/SiO$_2$ interface 120 were 3.5 nm, 3.9 nm, and 4.4 nm, respectively. The average value of these measurement values from the 30-degree incline relative to the direction orthogonal to the SiC/SiO$_2$ interface 120 was about 3.9 nm and a correction value projecting the average value on a plane parallel to the SiC/SiO$_2$ interface 120 was 1.95 nm (=3.95 nm/2). Here, the thickness t101 of the HTO film 107 was 60 nm.

From the results depicted in FIG. 10, it was confirmed that not only in an instance in which the SiO$_2$ film that forms the gate insulating film is formed by thermal oxidation but also in an instance in which the SiO$_2$ film (the HTO film 107) that forms the gate insulating film is an HTO formed by a general method performed normally, Si in the SiC is oxidized and excess carbon is precipitated at the SiC (semiconductor substrate 130) surface where the HTO film 107 is deposited. This excess carbon remains near the SiC/SiO$_2$ interface 120 and from the SiC/SiO$_2$ interface 120, in a direction parallel to the SiC/SiO$_2$ interface 120, diffuses a distance of about 2 nm into the HTO film 107 to be taken therein.

The amount of precipitation and diffusion range of the excess carbon differs slightly according to the HTO apparatus and formation conditions, however, normally, the precipitation of the excess carbon occurring due to the oxidation of the SiC surface during formation of the HTO film 107 cannot be completely eliminated. In one sample of the conventional example depicted in FIG. 10, the excess carbon diffuses from the SiC/SiO$_2$ interface 120 in a direction parallel to the SiC/SiO$_2$ interface 120 to a position (measured position) about 10 nm inside the HTO film 107. Therefore, minimizing the excess carbon remaining in the SiC/SiO$_2$ interface 120 and gate insulating film (the HTO film 107 and the SiO$_2$ film 111) as much as possible is linked to electrical characteristics.

The start 61 of decrease of the carbon concentration is an intersection of a straight line (coarse dashed line parallel to the horizontal axis) approximating a segment of the carbon concentration profile where the carbon concentration in the semiconductor substrate 130 does not vary and a straight line (fine dashed oblique line along the carbon concentration profile) of the rate of decrease (negative slope of the carbon concentration profile) of the carbon concentration of the interface segment 60. The end 63 of decrease of the carbon concentration is an intersection of the straight line of the rate of decrease of the carbon concentration of the interface segment 60 and the carbon concentration profile, in the HTO film 107.

The end 62 of increase of the oxygen concentration is an intersection of a straight line (coarse dashed line parallel to the horizontal axis) approximating a segment of the oxygen concentration profile where the oxygen concentration in the HTO film 107 does not vary and a straight line (fine dashed oblique line along the oxygen concentration profile) of the rate of increase (positive slope of the oxygen concentration profile) of the oxygen concentration of the interface segment 60. The start 64 of increase of the oxygen concentration is an intersection of the straight line of the rate of increase of the oxygen concentration of the interface segment 60 and the oxygen concentration profile, in the semiconductor substrate 130.

In the example above, as described, during formation of the HTO films 46 (refer to FIGS. 5, 6), excess carbon occurring near the SiC/SiO$_2$ interfaces 20 and in the gate insulating films 7 is removed. As a result, while not depicted, the distance that the excess carbon diffuses into the gate insulating films 7 from the SiC/SiO$_2$ interfaces 20 is shallow, the end of decrease of the carbon concentration of the mass concentration profile of the carbon element (corresponds to reference numeral 63 in FIG. 10) shifts toward the SiC side, and the rate of decrease (negative slope of the carbon concentration profile) of the carbon concentration becomes steep. The width of a portion of the interface segment of the example, from the SiC/SiO$_2$ interfaces 20 toward the gate insulating films 7 (SiO$_2$ side) is narrower as compared to the conventional example.

In the foregoing, the present invention is not limited to the embodiments described above and various modifications within a range not departing from the spirit of the invention are possible. For example, dimensions and impurity concentrations of regions, etc. are variously set according to necessary specifications.

According to the invention described above, before the formation of the gate insulating films, oxygen is ion implanted into the sidewalls of the trenches, and the oxygen ion-implanted layers having the oxygen concentration distribution that steeply decreases with increasing distance from the sidewalls of the trenches in a direction orthogonal to the sidewalls of the trenches and in which the peak concentration is exhibited at the surface of the sidewalls of the trenches is formed. The oxygen in the oxygen ion-implanted layers, thereafter, diffuses when the gate insulating films are deposited on the sidewalls of the trenches and reacts with the excess carbon near the sidewalls of the trenches and the excess carbon in the gate insulating films. As a result, the excess carbon becomes an oxocarbon and is desorbed, whereby the excess carbon may be reduced as compared to an instance in which the gate insulating films are an HTO formed by a general method performed normally, without performing the ion implantation of oxygen.

The silicon carbide semiconductor device and method of manufacturing a silicon carbide semiconductor device according to the present invention achieve an effect in that electrical characteristics and reliability may be improved.

As described above, the silicon carbide semiconductor device and the method of manufacturing a silicon carbide semiconductor device according the invention are useful for power semiconductor devices used in power converting equipment and in power source devices such as those in various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device including insulated gates each having a three-layered structure including a gate, an oxide film, and a semiconductor, the silicon carbide semiconductor device, comprising:
   a semiconductor substrate constituting the semiconductor and containing silicon carbide, the semiconductor substrate having a first main surface and a second main surface opposite each other;
   a plurality of trenches each having a predetermined depth from the first main surface of the semiconductor substrate in a depth direction orthogonal to the first main surface of the semiconductor substrate, each trench having an inner wall that includes opposing sidewalls parallel to the depth direction;
   a plurality of gate insulating films constituting the oxide film, each gate insulating film being provided along said inner wall of said each trench, and being deposited oxide film; and
   a plurality of gate electrodes constituting the gate, each gate electrode being provided on said each gate insulating film in said each trench,
   wherein the semiconductor substrate includes a plurality of high-oxygen-concentration regions, each disposed in a region that forms a corresponding one of the opposing sidewalls of said each trench, between a first end and a second end apart from the first end in the depth direction, the first end being located at a position apart from the first main surface of the semiconductor substrate in the depth direction, the second end being located at a position closer to the first main surface than is a bottom of said each trench, each high-oxygen-concentration region extending from a surface of a corresponding one of the opposing sidewalls of said each trench toward inside the semiconductor substrate in a thickness direction orthogonal to the depth direction to have a thickness of at most half of a thickness of said each gate insulating film, and
   wherein said each high-oxygen-concentration region has an oxygen concentration that is greater than an oxygen concentration of any other region in the semiconductor substrate, that is greater than $1\times10^{15}/cm^3$ and that increases in the thickness direction with increasing proximity to the corresponding one of the opposing sidewalls of said each trench.

2. The silicon carbide semiconductor device according to claim 1, wherein
   said each high-oxygen-concentration region extends from the surface of the corresponding one of the opposing sidewalls of said each trench in the thickness direction to have the thickness of at most 30 nm.

3. The silicon carbide semiconductor device according to claim 2, wherein
   said each high-oxygen-concentration region extends from the surface of the corresponding one of the opposing sidewalls of said each trench in the thickness direction to have the thickness in a range from 20 nm to 25 nm.

4. The silicon carbide semiconductor device according to claim 1, wherein
   the oxygen concentration of said each high-oxygen-concentration region exhibits a maximum value at the surface of the corresponding one of the opposing sidewalls of said each trench and progressively decreases with increasing distance from the surface of the corresponding one of the opposing sidewalls of said each trench in the thickness direction.

5. The silicon carbide semiconductor device according to claim 4, wherein
   the maximum value of the oxygen concentration of said each high-oxygen-concentration region is in a range from $5\times10^{17}/cm^3$ to $1\times10^{20}/cm^3$.

6. The silicon carbide semiconductor device according to claim 1, wherein
   an amount of carbon atoms contained in said each gate insulating film is at most 10 at %.

7. The silicon carbide semiconductor device according to claim 1, wherein
   the thickness of said each gate insulating film is uniform spanning an entire area of the inner wall of said each trench.

8. The silicon carbide semiconductor device according to claim 1, further comprising:
   a first semiconductor region of a first conductivity type, provided in the semiconductor substrate;
   a second semiconductor region of a second conductivity type, provided between the first main surface of the semiconductor substrate and the first semiconductor region, the second semiconductor region having therein the high-oxygen-concentration regions;
   a plurality of third semiconductor regions of the first conductivity type, provided selectively between the first main surface of the semiconductor substrate and the second semiconductor region;
   a first electrode electrically connected to the third semiconductor regions and the second semiconductor region; and
   a second electrode provided on the second main surface of the semiconductor substrate, wherein
   the trenches each penetrate a corresponding one of the third semiconductor regions and the second semiconductor region and reach the first semiconductor region.

9. A method of manufacturing the silicon carbide semiconductor device according to claim 1, the method comprising:
   preparing the semiconductor substrate;
   forming a first oxide film mask having openings at predetermined positions, the first oxide film mask being formed on the first main surface of the semiconductor substrate;

using the first oxide film mask, forming the trenches;

forming a second oxide film mask along a surface of the first oxide film mask and along the inner wall of said each trench;

performing an ion implantation of oxygen to the opposing sidewalls of said each trench from the second oxide film mask and thereby forming an oxygen ion-implanted layer extending from surfaces of the opposing sidewalls of said each trench toward inside the semiconductor substrate in the thickness direction orthogonal to the depth direction to have the thickness of at most half of the thickness of the gate insulating film to be formed, a depth position of a range of the ion implantation being set to be within a second oxide film mask;

removing the first oxide film mask and the second oxide film mask;

depositing the gate insulating film along the inner wall of said each trench under an atmosphere of a temperature higher than a bonding temperature of carbon and oxygen; and forming gate electrodes on the gate insulating films in the trenches, the gate electrodes constituting the gate.

10. The method according to claim 9, wherein in the second oxide film mask, portions thereof covering upper and lower portions of the opposing sidewalls of said each trench in the depth direction are formed having a thickness enabling blocking of ion-implanted oxygen, and wherein the ion-implantation is performed from an oblique direction at a predetermined implantation angle relative to the depth direction.

11. The method according to claim 9, wherein the ion-implantation is performed using an acceleration energy of at most 50 keV, and wherein the ion-implantation is performed using a dose amount in a range from $5\times10^{12}/cm^2$ to $5\times10^{14}/cm^2$.

12. The method according to claim 9, wherein the preparing the semiconductor substrate includes:

forming the semiconductor substrate before forming the first oxide film mask, the semiconductor substrate being formed by sequentially depositing, on a starting substrate containing silicon carbide, a silicon carbide layer of a first conductivity type constituting a first semiconductor region of the first conductivity type and a silicon carbide layer of a second conductivity type constituting a second semiconductor region of the second conductivity type; and selectively forming a plurality of third semiconductor regions in the silicon carbide layer of the second conductivity type, wherein said each trench is formed penetrating a corresponding one of the third semiconductor regions and the second semiconductor region, and reaching the first semiconductor region, and wherein said each oxygen ion-implanted layers is formed in the second semiconductor region.

\* \* \* \* \*